United States Patent
Lakaniemi (10) Patent No.: US 7,337,384 B2
(45) Date of Patent: Feb. 26, 2008

(54) ERROR DETECTION SCHEME WITH PARTIAL CHECKSUM COVERAGE

(75) Inventor: Ari Lakaniemi, Helsinki (FI)

(73) Assignee: Nokia Corporation, Espoo (FI)

( * ) Notice: Subject to any disclaimer, the term of this patent is extended or adjusted under 35 U.S.C. 154(b) by 507 days.

(21) Appl. No.: 10/462,823

(22) Filed: Jun. 17, 2003

(65) Prior Publication Data

US 2004/0163025 A1 Aug. 19, 2004

Related U.S. Application Data

(60) Provisional application No. 60/447,755, filed on Feb. 19, 2003.

(51) Int. Cl.
*H03M 13/00* (2006.01)

(52) U.S. Cl. .................. 714/776; 270/464

(58) Field of Classification Search ......... 370/464–475
See application file for complete search history.

(56) References Cited

U.S. PATENT DOCUMENTS

| | | | |
|---|---|---|---|
| 6,289,023 B1* | 9/2001 | Dowling et al. ............ 370/419 |
| 6,530,061 B1* | 3/2003 | Labatte ..................... 714/807 |
| 6,754,231 B1* | 6/2004 | Jonsson et al. ............ 370/474 |
| 6,879,581 B1* | 4/2005 | Leung ...................... 370/352 |
| 6,985,459 B2* | 1/2006 | Dickson .................... 370/328 |
| 7,069,495 B2* | 6/2006 | Soderberg et al. ......... 714/776 |
| 2002/0071432 A1* | 6/2002 | Soderberg et al. ......... 370/389 |
| 2003/0185239 A1* | 10/2003 | Miller et al. ............... 370/474 |

* cited by examiner

*Primary Examiner*—Jacques Louis-Jacques
*Assistant Examiner*—Sam Rizk
(74) *Attorney, Agent, or Firm*—Squire, Sanders & Dempsey, LLP (57) ABSTRACT

A method and device perform error detection with partial checksum coverage by using a first transport protocol, wherein interface means are provided for requesting from a second lower-level transport protocol at least one lower-level header field to be subjected to checksum calculation over a predetermined portion of a data packet of the first transport protocol and the requested lower-level header fields. A checksum-based error processing function of the lower-level second transport protocol is disabled during the transmission of the data packet. Thereby, a checksum with partial coverage can be carried inside a higher-level data packet to provide Unequal Error Detection (UED) for error tolerant applications without requiring modifications of lower layer protocols.

31 Claims, 4 Drawing Sheets

ERROR DETECTION SCHEME WITH PARTIAL CHECKSUM COVERAGE

CROSS-REFERENCE TO RELATED APPLICATIONS

This application claims priority of U.S. Provisional Patent Application Ser. No. 60/447,755 entitled "Error Detection Scheme with Partial Checksum Coverage," filed Feb. 19, 2003, the entire contents of which are incorporated herein by reference.

BACKGROUND OF THE INVENTION

Field of the Invention

The invention relates to a method and device for performing an error detection with partial checksum coverage, and to a program product for providing an interface between protocol layers to enable the error detection.

SUMMARY OF THE INVENTION

In recent years, network applications for transmitting and receiving audio and video content over the Internet have been developed and deployed on a large scale. New multimedia network applications, such as entertainment video, IP (Internet Protocol) telephony, Internet radio, multimedia WWW sites, teleconferencing, interactive games, virtual worlds, distance learning and the like are increasing steadily. The service requirements of these applications differ significantly from those of traditional data-oriented applications such as web-text/image, e-mail, FTP (File Transfer Protocol), and DNS (Domain Name System) applications. In particular, multimedia applications are highly sensitive to end-to-end delay and delay variation, but can tolerate occasional loss of data. These fundamentally different service requirements suggest that a network architecture designed primarily for data communication may not be well suited for supporting multimedia applications.

IP-based networks are originally designed for transmission of data, which in general case means that no bit errors are tolerated in the received packets. This has led to solutions where the integrity of the complete data packet is verified upon reception, and invalid packets are discarded. For example, UDP (User Datagram Protocol) as specified in the IETF (Internet Engineering Task Force) specification RFC 768 follows this paradigm by using a checksum to cover the full UDP packet. It is noted that the UDP checksum coverage is extended also to the lower protocol layer, in this case the IP layer, by covering also some of the most important fields of the IP header. An alternative to the use of a checksum with full coverage is simply not to use the UDP checksum at all. Treating all bits in a packet with equal importance can be considered to provide an EED (Equal Error Detection).

As already mentioned, multimedia types of applications, such as voice, audio and video applications, can usually tolerate some amount of bit errors while still maintaining the subjective quality provided by the application at an acceptable level. E.g. in a speech application roughly speaking, the subjective speech quality is a function of the frame error rate, i.e. the percentage of corrupted speech frames. With this assumption, the error tolerant nature of speech transmission can be exploited in a transmission network designed by ensuring that important data is received correctly at a sufficiently high probability, but allowing toleration of some errors in less important parts of the data. Thereby, a lower frame error rate is provided than would result from treating all data bits in an equal manner. For example, in GSM (Global System for Mobile communications) speech is transmitted as frames of 20 ms duration, and encoded speech bits within a frame are divided into three importance classes. Decoding and playing a frame with error(s) in the most important speech bits is likely to cause severe quality degradation, and therefore all such frames are dropped and error concealment is applied to replace the damaged frame. On the other hand, bit errors in the speech bits of lower importance classes are not considered to cause audible quality degradation, such that the corresponding frame can be used for decoding and playback as if there were no error at all. This procedure results in better speech quality than dropping these frames and replacing them with the error concealment procedure. This approach is referred to as UED (Unequal Error Detection).

Emerging VoIP (Voice over IP) technologies are basically used to transmit speech frames as packets over IP networks originally designed for data transmission. A typical protocol stack for VoIP traffic is RTP (Real-time Transport Protocol) over UDP over IP as specified in the IETF specification RFC 1889. The usage of UDP and IP also implies that the same procedures are used for verifying the integrity of received packets for VoIP traffic as is used for generic data traffic. Specifically, in case of an IP/UDP/RTP protocol stack, the UDP checksum covers the whole packet including the RTP payload carrying the speech frame(s), and bit errors also in less important bits of the speech data would cause the whole packet to be discarded or dropped as invalid. As explained above, this is not a preferred mode of operation, e.g. for VoIP applications point of view. Better speech quality can be achieved if packets having errors only in less important speech bits were handled as if there were no errors detected. On the other hand, although it would be possible to run UDP without checksum, it is not a good approach since undetected bit errors in the important speech bits would cause severe quality degradation in the received signal, and also would leave the UDP headers and possibly also IP headers totally without error detection.

One of the suggested approaches is the so-called "UDP Lite" which allows senders to specify packets as partially insensitive to errors. The coverage of the checksum is specified by the sending application on a per-packet basis. Because of its close relationship to UDP, UDP Lite can be easily integrated into an existing UDP implementation. Thus, UDP Lite provides the possibility to use the checksum in such a way that only a selected part at the beginning of the data is covered. When full checksum coverage is used, an UDP Lite packet looks exactly the same as a conventional UDP packet. Thus, partial checksum coverage provided by UDP Lite enables a simple UED mechanism for VoIP, since the speech data inside a data packet, e.g. a RTP packet, can be arranged in such a way that the most important speech bits are at the beginning of the packet.

However, one problem with UDP Lite is that the IP protocol layer will handle it as a different protocol in view of the fact that the respective field of the IP header indicating the next level protocol will have different values for UDP and UDP Lite. Hence, a vast number of currently deployed UDP implementations cannot deal with UDP Lite in fully interoperable manner. In view of the fact that VoIP or other multimedia traffic transmitted over IP networks is expected to increase in the near future and do benefit from the possibility of using UED, a generally applicable solution of a checksum with partial coverage for IP networks would be highly desirable.

SUMMARY OF THE INVENTION

The invention provides a method and device, by means of which a generally applicable error detection scheme with partial checksum coverage can be provided.

According to one embodiment, an error detection device for performing error detection with partial checksum coverage by using a first transport protocol is provided. The device includes an interface means and a checksum calculation means. The interface means requests from a second transport protocol at least one lower-level header field to be subjected to checksum calculation. The first transport protocol is a transport protocol of a higher level than the second transport protocol. The checksum calculation means calculates a checksum covering a predetermined portion of a data packet of the first transport protocol and the requested header fields of the lower-level second transport protocol.

Furthermore, in another embodiment, an error detection method of performing error detection with partial checksum coverage by a first transport protocol is provided. The method includes the steps of:

requesting from a second transport protocol at least one respective lower-level header field to be subjected to checksum calculation;

calculating a checksum covering a predetermined portion of a data packet and the requested lower-level header fields; and transmitting information indicating the calculated checksum and the predetermined portion in a data packet of the first transport protocol.

Accordingly, a checksum with partial coverage can be carried inside a data packet of a higher transport protocol level e.g. to provide UED for VoIP or other error tolerant packet switched applications for better subjective quality and more efficient use of network resources. The invention further enables usage of lower layer protocols, e.g. IP and UDP, without any modifications. Thereby, better quality for speech, voice and/or video traffic can be achieved over error prone links, such as cellular radio links. The invention can be used with any application that uses a data stream including bits with different levels of subjective importance. Due to the fact that the invention does not require any changes to lower-level protocols, such as IP or UDP, it is fully backwards compatible. In addition, as the error detection mechanism is transferred to a higher level transport protocol, a possibility is given to use a stronger error detection mechanism as currently used in UDP or UDP Lite, if necessary.

At the transmitting end, disabling means may be provided for disabling a checksum functionality of a second transport protocol, setting means may be provided for setting in the data packet information indicating the calculated checksum and a control information indicating the predetermined portion, and forwarding means may be provided for forwarding the data packet to the second transport protocol. In this embodiment, the checksum information and the control information may be set as part of a header or payload of the data packet.

As an alternative embodiment, the control information for partial checksum coverage not necessarily needs to be carried inside each packet but it can be specified in such a way that the control information is fixed within a specific profile/payload type, i.e. fixed and specified as part of the partial checksum coverage specification.

As a further alternative embodiment, the control information for a profile/payload type that is used for a session is negotiated during a session set-up by using parameters specified as part of the partial checksum coverage specification.

At the receiving end, receiving means may be provided for receiving the data packet from the second transport protocol, comparing means may be provided for comparing the calculated checksum with a checksum information derived from the data packet, and error processing means may be provided for performing error processing based on the comparison result. Furthermore, detection means may be provided for detecting in the data packet a control information indicating the predetermined portion.

In the above alternative embodiments, the checksum information can be derived from the set-up negotiation and stored at the receiving end to be used for checksum verification.

The first transport protocol may be RTP and the second transport protocol may be UDP. Then, the predetermined portion may cover at least a portion of an IP header, a UDP header, an RTP header and a selected part of an RTP payload.

Furthermore, the interface means may be a socket interface.

As to the forwarding of the checksum information and the control information several possibilities can be applied. The checksum information and control information may be carried in an RTP header extension. This approach would enable RTP-level UED for any RTP payload format. As an alternative, the checksum information and the control information may be carried in a payload header of a predetermined RTP profile. Thereby, a payload header common to all payload formats may be introduced at the beginning of the payload portion. As a further alternative embodiment, the checksum information and the control information may be carried in a predetermined dedicated RTP payload format. Thus, the RTP-level UED can be specified as an own RTP payload format. In particular, the dedicated RTP payload format may be a codec-specific format. Thereby, the most efficient solution for the individual payload format can be provided.

BRIEF DESCRIPTION OF THE DRAWINGS

In the following, the invention will be described in greater detail based on preferred embodiments with reference to the drawings, in which.

DESCRIPTION OF THE PREFERRED EMBODIMENTS

The preferred embodiments will now be described on the basis of an RTP-level UED system for error tolerant speech, audio and/or video applications, such as VoIP.

Figure 1:
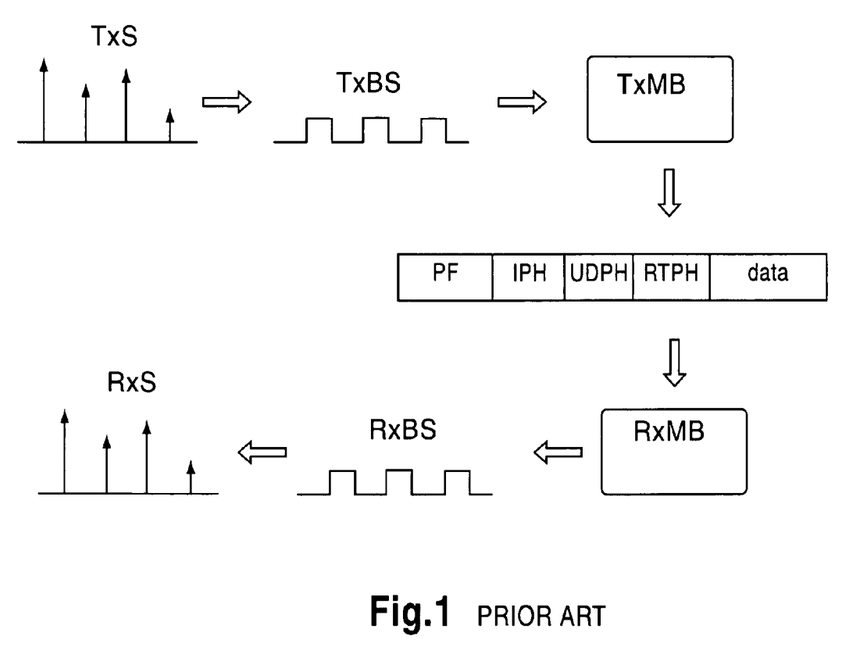
FIG. 1 shows a basic principle of a transmission of a speech, audio or video signal over an IP network.

FIG. 1 shows a schematic diagram indicating basic steps for transmitting a speech, audio or video signal over an IP network. Speech, audio or video samples TxS at the transmitting end are analog-to-digital converted and encoded at an input device to generate a bit stream TxBS including the sequence of coded samples. The coded samples are copied into a memory buffer TxMB in blocks of a predetermined frame length. Then, the bit stream is subjected to a coding and packetization process, where header information of different protocol layers is added to separated blocks of samples. In the embodiments of the invention, a physical frame PF, an IP header IPH, an UDP header UDPH and an RTP header RTPH is added to the data block. In particular, the data block with RTP header is written into a socket interface which then provides UDP/IP functionality and inserts the IP header IPH and the UDP header UDPH. The socket interface provides an interface between the selected application process and the transport protocol layer. The socket interface can be regarded as a programming interface by which network applications are build in the IP network. The socket interface provides a means for controlling the transport-layer side of the socket to a certain extent. The data packet with the different headers is then transferred over the concerned IP network.

At the receiving end, the header information is removed, the data block is decoded according to the selected transmission and samples are written into a memory buffer RxMB. The block of samples is then copied from the memory buffer RxMB and supplied as a bit stream RxBS to an output device, where the digital samples are decoded and digital-to-analog converted into corresponding analog samples RxS.

RTP is typically run on top of UDP to make use of its multiplexing and checksum function. TCP (Transmit Control Protocol) and UDP are the most commonly used transport protocols on IP networks. TCP provides a connection-oriented and reliable flow between two hosts, while UDP provides a connectionless but unreliable datagram service over the IP network. UDP was chosen as the target transport protocol for RTP for two reasons. First, RTP is primarily designed for multicast, while the connection-oriented TCP does not scale well and is therefore not suitable. Second, for real-time data, the reliability is not as important as timely delivery. Even, reliable transmission provided by retransmissions as in TCP is not desirable. For example, in network congestion situations, some packets might get lost and the application would result in lower but acceptable quality. If the protocol insists on a reliable transmission, the retransmitted packets could possibly increase the delay, jam the network, and eventually starve the receiving application. Therefore, UDP is better suited as transport protocol for real-time data. Time stamping is the most important information for real-time applications. The sender sets the time stamp according to the instant the first octet in the packet was sampled. After receiving data packets, the receiver uses the time stamp to reconstruct the original timing in order to play out the data in correct rate. UDP does not deliver packets in a timely order. Thus, sequence numbers are used to place the incoming data packets in the correct order. The sequence numbers are also used for packet loss detection. For example, when a video frame is split into several RTP packets, all of them can have the same time stamp. Therefore, the time stamp by itself is not enough to put the packets into the correct order.

However, RTP is a protocol framework which is deliberately not complete. It is open to new payload formats and new multimedia software. By adding new profile and payload format specifications, RTP can be tailored to new data formats and new applications.

According to the preferred embodiments, a checksum with partial coverage is carried inside the RTP packet to provide UED for error tolerant packet switched applications to thereby achieve better quality and more efficient usage of network resources. Due to the full transfer of UED to the higher RTP protocol level, IP and UDP protocols are not affected, such that currently deployed UDP implementations are fully interoperable with the proposed UED mechanism. Hence, full backwards compatibility can be assured.

Figure 2:
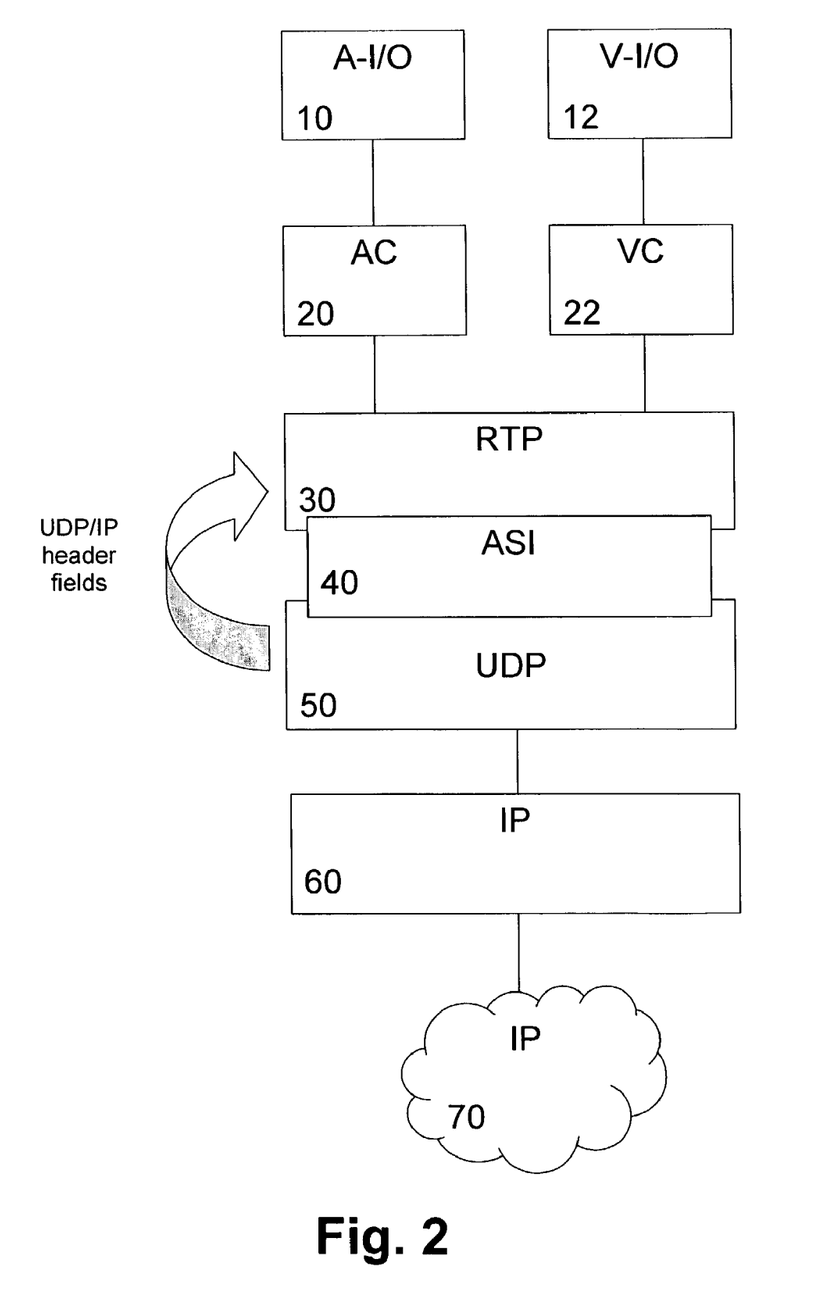
FIG. 2 shows a schematic diagram of a protocol structure according to the preferred embodiments of the invention.

FIG. 2 shows a protocol structure of the RTP-level UED mechanism according to the preferred embodiments. In the example of FIG. 2, an audio input/output (I/O) equipment 10 provides audio data via an audio codec application 20 to the RTP module or layer 30. Furthermore, a video I/O equipment 12 provides video data via a video codec application 22 to the RTP module 30. The video codec may provide a coding/decoding processing function according to H.261 or H.263 or other specifications. The audio codec application 20 may provide a coding/decoding processing function according to the G.711, G.722, G.723, G.728, G.729 or other specifications. The RTP module 30 includes a real-time transport protocol functionality used to carry data with real-time properties and an RTP control protocol (RTCP) functionality used to monitor quality of service and conveying information about the participants in an on-going conference. Generally, the RTP implementation will be integrated into an application rather than implemented as separate protocol. The RTP framework is relatively loose allowing modifications and tailoring depending on the application.

Furthermore, a programming interface, for example an alternative basic socket interface 40 or the like, is provided to obtain from the lower UDP level 50 information required for implementing the UED mechanism. As indicated in FIG. 2, the programming interface 40 is adapted to provide knowledge about UDP header and IP header fields subjected to checksum coverage. The IP stack further comprises an IP network layer 60 which may be based on the IPv4 protocol version. The remaining physical and data link layers required for providing a connection to the IP network 70 are not shown in FIG. 2.

The UDP layer 50 passes a transport-layer segment or packet including the RTP packet with the checksum and UED control information and a destination address to the IP layer 60 which then provides the services of routing the segment to its destination. When the packet arrives at the destination, the IP layer at the destination passes the segment to the UDP layer at the destination, where error detection and processing is performed on the basis of the checksum information.

The partial checksum covers the same fields of the IP header as the conventional UDP checksum which is disabled in the preferred embodiments. Furthermore, the partial checksum covers the UDP header, the RTP header, and a selected part of the RTP payload. The conventional UDP checksum cannot be used, since otherwise the UDP module 50 which is not necessarily aware of error detection in the RTP module 30 would also drop packets heaving errors in the part not covered by the RTP checksum. The calculated checksum and necessary control fields can be added to the RTP packet, either as part of the RTP header or as a part of the RTP payload.

Figure 3:
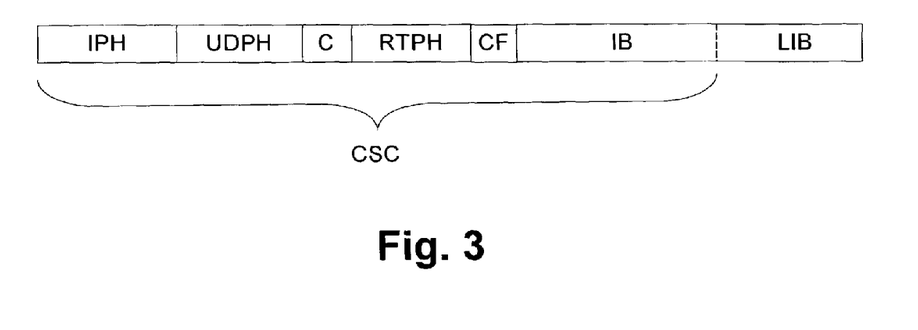
FIG. 3 shows a packet structure according to the embodiments.

FIG. 3 shows a schematic diagram indicating a data packet with partial checksum coverage inside the RTP packet portion. The packet as routed through the IP network 70 comprises the IP header IPH, the UDP header UDPH with an UDP checksum field C, the RTP header RTPH, a checksum information CF, an important data portion IB and a less important data portion LIB. As indicated in FIG. 3, all portions of the data packet except for the less important data portion LIB are included in the partial checksum coverage area CSC for which the checksum is calculated in the RTP module 30. It is noted that the checksum part of the checksum information CF needs to be set to a predetermined checksum value, e.g. to zero, for the checksum calculation. The location of the checksum information CF including the checksum value and associated control information can be varied according to the following preferred embodiments.

According to a first preferred embodiment, the checksum and associated control data may be carried in an RTP header extension specified for this purpose. The RTP specification provides a possibility to specify application-specific extensions to the RTP header. The basic format of such a specific header extension is described in the IETF specification RFC 1889. According to this specification, the X bit in the RTP header is set to "1" in order to indicate that a variable-length header extension is appended to the RTP header. The header extension contains a 16-bit length field which counts the number of 32-bit words in the extension, excluding the four-octet extension header. This provides enough space to convey the checksum and associated control information. In principle, this approach would enable RTP-level UED for any current RTP payload format but the solution would suit best for such payloads where the data is arranged in such a manner that the most important bits are at the beginning of the payload, such as the RTP payload format for Adaptive Multi-Rate (AMR) and Adaptive-Multi-Rate Wideband (AMR-WB) audio codecs, as specified in the IETF specification RFC 3267.

According to a second preferred embodiment, the checksum and associated control information may be conveyed or carried using a new RTP profile which always introduces a payload header common to all payload formats at the beginning of the payload. Although there is currently only one specified RTP profile, i.e. the audio/video profile specified by RFC 1890, the RTP specification (RFC 1889) provides the possibility to specify additional profiles, as is currently being done for RTCP-based feedback and secure RTP as specified in the respective IETF internet-drafts "Extended RTP Profile for RTCP-based Feedback (RTP/AVPF)" by J. Ott et al, May 2, 2003, and "The Secure Real-Time Transport Protocol" by Baugher et al, May 2003 (all of which are incorporated herein by reference).

According to a third preferred embodiment, the RTP-level UED is specified as its own RTP payload format, wherein data can be encapsulated according to a selected RTP payload format. However, because in this embodiment the payload type field of the RTP header indicates the usage of RTP-level UED payload format, the RTP-level UED data, e.g. the checksum and associated control information, may need to include also a payload type identifier indicating the actual payload format carried in the packet.

The third preferred embodiment may be modified to implement RTP level ULED as a part of the specific RTP payload format, i.e. for each speech or audio or video codecs separately. While this may provide the most efficient solution for the payload format in question, it may also imply a slightly different approach for each payload type.

In summary, the checksum information CF, including the checksum value and associated UED control information, indicated in FIG. 3 can be arranged in the RTP packet according to one of the above preferred embodiments.

According to a fourth preferred embodiment, the proposed partial checksum coverage mechanism as defined in the first to third embodiments may be modified in such a way that the checksum coverage area CSC, i.e. which part of the packet or payload, is directly and uniquely specified by at least one of the selected profile and or payload type used for the partial checksum mechanism. Although this option may sacrifice some flexibility to adjust the partial checksum coverage according to the transmission conditions, it saves some bits or bytes due to the fact that the respective control information does not have to be transmitted in each data packet.

According to a fifth preferred embodiment, the checksum coverage area CSC can be negotiated during session set-up by using at least one parameter defined as a part of the specification of the proposed partial checksum mechanism, e.g. a payload type specific parameter. As in the fourth preferred embodiment, this option saves transmission of the respective control information in each data packet. However, contrary to the fourth preferred embodiment, some flexibility is still maintained to specify the checksum coverage area according to at least one of the prevailing transmission conditions and application requirements during session set-up.

To implement the above embodiments, the protocol interface between the IP/UDP modules 50, 60 and the RTP module 30 must be adapted to provide information about the IP and UDP header portions to be covered by the checksum calculation in the RTP module 30. This protocol interface can be provided by using the programming interface 40 indicated in FIG. 2, which may incorporate a requesting functionality for requesting the required header information from the UDP module 50 and/or IP module 60. In specialized devices, such as mobile terminals or user equipments or VoIP terminals, such an alternative circuit interface may be used to provide better performance for applications which benefit from UED.

In the following, the proposed RTP-level UED is described on the basis of a flow diagram of FIG. 4, indicating processing steps at the transmitting end and a flow diagram of FIG. 5 indicating processing steps at the receiving end.

Figure 4:
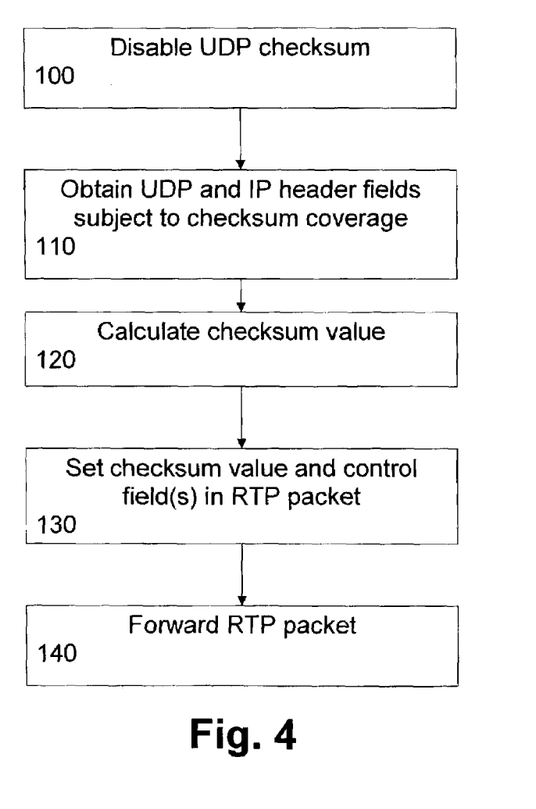
FIG. 4 shows a flow diagram of a transmission part of an error detection scheme according to the preferred embodiments.

In step 100 of FIG. 4, the UDP checksum functionality provided by the UDP module 50 is disabled by a corresponding bit setting of the checksum field C of the UDP header UDPH of FIG. 3. In step 110, the alternative circuit interface 40 obtains UDP and IP header fields subjected to checksum coverage and forwards them to the RTP module 30 which calculates a checksum value in step 120 covering the UDP and IP header fields, the RTP header and a selected part of the RTP payload, which selected part corresponds to important speech, audio or video bits. Any known checksum calculation and coding algorithm may be used for calculating and setting the checksum information in the RTP header or payload portion. One simple checksumming method may be to treat the bits of the checksum area CSC of FIG. 3 as a sequence of k-bit integers and to simply sum these k-bit integers and use the resulting sum as the error detection bits. The so-called Internet checksum is based on this approach, wherein bytes of data are treated as 16-bit integers and their ones-complement sum forms the Internet checksum. Further details of the Internet checksum algorithm and its implementation are described in the IETF specification RFC 1071.

Other improved weighted checksum codes suitable for high-speed software implementations are described in "Weighted Sum Codes for Error Detection and Their Comparison with Existing Codes", A. McAuley, IEEE/ACM Transactions on Networking, Vol.2, No.1, February 1994, pp. 16-22, and fast software implementation techniques not only for weighted checksum codes are described in "Fast Software Implementation of Error Detection Codes", IEEE/

ACM Transactions on Networking, Vol. 3, No. 6, December 1995, pp. 640-652 (all of which are incorporated herein by reference).

Finally, in step 140, the RTP packet with the checksum value and optionally the associated checksum control information, if not negotiated or predefined, is forwarded to a client terminal at the receiving end.

Figure 5:
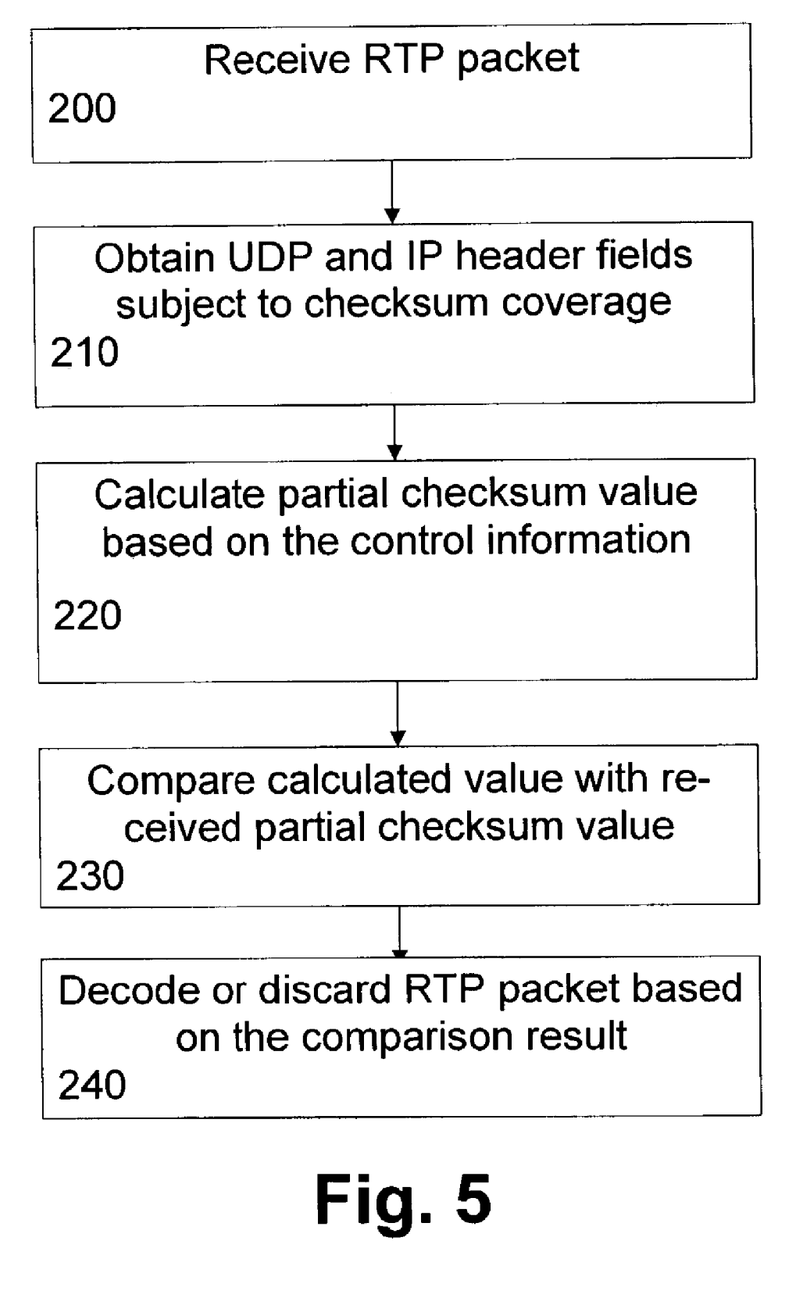
FIG. 5 shows a flow diagram of a receiving part of an error detection scheme according to the preferred embodiments.

According to the flow diagram of FIG. 5, the RTP packet is received at the receiving end in step 200. The RTP module 30 obtains the covered UDP and IP header fields from the programming interface 40 in step 210 and calculates a partial checksum value based on the received and detected or negotiated or predefined control information indicating the checksum coverage area CSC in step 220. Furthermore, in step 230, the calculated partial checksum value is compared to the received partial checksum value indicated in the received RTP packet. In response to the comparison result obtained in step 230, the received RTP packet is decoded and forwarded to an output unit, or discarded if an error is detected, i.e. the calculated checksum value differs from the received checksum value (step 240).

In summary, a checksum with partial coverage is carried inside the RTP packet to provide UED for error tolerant packet switched application to achieve better subjective quality and more efficient usage of the network resources without any modification of existing UDP and IP protocol layers. It is noted, that the invention can be applied in any transport or application protocol level to thereby provide a specified checksum-based error detection with partial coverage, without any modifications of lower protocol levels. The preferred embodiments may thus vary within the scope of the attached claims.

The invention claimed is:

1. An error detection device, said device comprising:
   interface unit configured to request from a second transport protocol at least one lower-level header field to be subjected to checksum calculation, a first transport protocol being a protocol of a higher level than said second transport protocol; and
   checksum calculation unit configured to calculate a checksum covering a predetermined portion of a data packet of said first transport protocol and said requested header fields of said lower-level second transport protocol,
   wherein the error detection device is configured to perform error detection with partial checksum coverage by using said first transport protocol.

2. The device according to claim 1, further comprising: disabling unit configured to disable a checksum functionality of said second transport protocol, and a setting unit configured to set in said data packet a checksum information indicating said calculated checksum and a control information indicating said predetermined portion, and forwarding unit configured to forward said data packet to said second transport protocol.

3. The device according to claim 2, wherein said checksum information and said control information is set as part of a header or payload portion of said data packet.

4. The device according to claim 3, wherein said checksum information and said control information is carried in a Real-time Transport Protocol header extension.

5. The device according to claim 3, wherein said checksum information and said control information is carried in a payload header of a predetermined Real-time Transport Protocol profile.

6. The device according to claim 3, wherein said checksum information and said control information is carried in a predetermined dedicated Real-time Transport Protocol payload format.

7. The device according to claim 6, wherein said dedicated Real-time Transport Protocol payload format comprises a codec-specific format.

8. The device according to claim 1, further comprising:
   receiving unit configured to receive said data packet from said second transport protocol, comparing unit configured to perform a comparison between said calculated checksum with a checksum information derived from said data packet, and error processing unit configured to perform error processing based on a result of the comparison.

9. The device according to claim 8, further comprising:
   detecting unit configured to detect in said data packet a control information indicating said predetermined portion.

10. The device according to claim 1, wherein said first transport protocol comprises a Real-time Transport Protocol and said second transport protocol comprises a User Datagram Protocol.

11. The device according the claim 10, wherein said predetermined portion covers at least a portion of an IP header, a User Datagram Protocol header, a Real-time Transport Protocol header and a selected part of a Real-time Transport Protocol payload.

12. The device according to claim 1, wherein said interface unit further comprises a socket interface.

13. The device according to claim 1, wherein said device is further configured to derive said predetermined portion from at least one of a profile and a payload type specified for said data packet.

14. The device according to claim 1, wherein said device is further configured to derive said predetermined portion from a negotiation during session set-up.

15. An error detection method, said method comprising:
   requesting from a second transport protocol of a lower level than a first transport protocol at least one respective lower-level header field to be subjected to a checksum calculation;
   calculating a checksum covering a predetermined portion of a data packet and said requested lower-level header fields; transmitting information indicating said calculated checksum and said predetermined portion in a data packet of said first transport protocol; and
   performing error detection with partial checksum coverage by a first transport protocol.

16. The method according to claim 15, further comprising: disabling a checksum-based error processing function of said second transport protocol.

17. The method according to claim 15, further comprising: setting in said data packet a checksum information indicating said calculated checksum and a control information indicating said predetermined portion, and forwarding said data packet to said second transport protocol.

18. The method according to claim 17, wherein said setting further comprises setting said checksum information and said control information as part of a header or payload of said data packet.

19. The method according to claim 18, further comprising: carrying said checksum information and said control information in a Real-time Transport Protocol header extension.

20. The method according to claim 18, further comprising: carrying said checksum information and said control information in a payload header of a predetermined Real-time Transport Protocol profile.

21. The -method according to claim 18, further comprising: carrying said checksum information and said control information in a payload portion using a predetermined dedicated Real-time Transport Protocol payload format.

22. The method according to claim 21, wherein the carrying further comprises using said predetermined dedicated Real-time Transport Protocol payload format comprising a codec-specific format.

23. The method according to claim 15, further comprising: receiving said data packet, comparing said calculated checksum with a checksum information derived from said data packet to generate a comparison result, and performing error processing based on the comparison result.

24. The method according to claim 13, further comprising: detecting in said data packet a control information indicating said predetermined portion.

25. The method according to claim 15, wherein said requesting further comprises requesting from said second transport protocol being a User Datagram Protocol of a lower level than said first transport protocol being a Real-time Transport Protocol said at least one respective lower-level field to be subjected to said checksum calculation.

26. The method according to claim 25, wherein said calculating further comprises calculating the checksum covering said predetermined portion which covers at least a portion of an IP header, a User Datagram Protocol header, a Real-time Transport Protocol header and a selected part of a Real-time Transport Protocol payload.

27. The method according to claim 15, further comprising: using a socket interface to perform said requesting.

28. The method according to claim 15, wherein said calculating further comprises covering said predetermined portion specified by at least one of a selected profile and a payload type of said data packet.

29. The method according to claim 15, wherein said calculating further comprises covering said predetermined portion negotiated during a session set-up.

30. An error detection apparatus, said apparatus comprising:
an interface means for requesting from a second transport protocol at least one lower-level header field to be subjected to checksum calculation, said first transport protocol being a protocol of a higher level than said second transport protocol; and
a calculating means for calculating a checksum covering a predetermined portion of a data packet of said first transport protocol and said requested header fields of said lower-level second transport protocol,
wherein error detection is performed with partial checksum coverage by using a first transport protocol.

31. A computer program stored on a storage medium comprising computer instructions, the computer program causes a computer to:
request from a second transport protocol of a lower level than a first transport protocol at least one respective lower-level header field to be subjected to a checksum calculation;
calculate a checksum covering a predetermined portion of a data packet and said requested lower-level header fields; transmitting information indicating said calculated checksum and said predetermined portion in a data packet of said first transport protocol; and
perform error detection with partial checksum coverage by said first transport protocol.

* * * * *